(12) United States Patent
Kim et al.

(10) Patent No.: US 10,573,240 B2
(45) Date of Patent: Feb. 25, 2020

(54) DISPLAY DEVICE AND PRINTED CIRCUIT BOARD FOR SUPPLYING VOLTAGE TO THE DISPLAY DEVICE

(71) Applicant: LG DISPLAY CO., LTD., Seoul (KR)

(72) Inventors: EungKyu Kim, Gyeonggi-do (KR); YongKyu Park, Gyeonggi-do (KR); Seokyu Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 355 days.

(21) Appl. No.: 15/367,583

(22) Filed: Dec. 2, 2016

(65) Prior Publication Data
US 2017/0162119 A1    Jun. 8, 2017

(30) Foreign Application Priority Data

Dec. 2, 2015    (KR) ................... 10-2015-0171022

(51) Int. Cl.
*G09G 3/3258* (2016.01)
*G09G 3/3275* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3233; G09G 3/3275; G09G 3/3266; G09G 2320/0295;
(Continued)

(56) References Cited

U.S. PATENT DOCUMENTS

2008/0094325 A1\* 4/2008 Kim .................. G09G 3/3648
345/87
2008/0111810 A1    5/2008 Park
(Continued)

FOREIGN PATENT DOCUMENTS

CN    102959865 A    3/2013
CN    102968954 A    3/2013
(Continued)

OTHER PUBLICATIONS

Office Action dated Oct. 8, 2018, issued in counterpart Chinese Patent Application No. 201611100637.3.
(Continued)

*Primary Examiner* — Amr A Awad
*Assistant Examiner* — Maheen I Javed
(74) *Attorney, Agent, or Firm* — Morgan, Lewis & Bockius LLP

(57) ABSTRACT

A display device includes a switching circuit; a sub-pixel having a driving transistor and an organic light emitting diode (OLED) with an anode connected to the driving transistor; a driving voltage supply line to supply a driving voltage to the OLED through the driving transistor; a base voltage supply line connected to a cathode of the OLED through the switching circuit; a ground line to supply a ground voltage to the switching circuit; a first capacitor between the driving voltage supply line and the ground line; and a second capacitor between the base voltage supply line and the ground line. The switching circuit selectively supplies one of a first level voltage and a second level voltage as the base voltage, and the second level voltage is higher than the first level voltage at the ground voltage.

5 Claims, 12 Drawing Sheets

(51) Int. Cl.
*H01L 27/32* (2006.01)
*G09G 3/3266* (2016.01)
*G09G 3/3233* (2016.01)

(52) U.S. Cl.
CPC ....... *G09G 3/3275* (2013.01); *H01L 27/3262* (2013.01); *H01L 27/3265* (2013.01); *H01L 27/3276* (2013.01); *G09G 2300/0819* (2013.01); *G09G 2300/0842* (2013.01); *G09G 2310/08* (2013.01); *G09G 2320/0214* (2013.01); *G09G 2320/0223* (2013.01); *G09G 2320/0233* (2013.01); *G09G 2320/0295* (2013.01); *G09G 2320/043* (2013.01); *G09G 2330/021* (2013.01)

(58) Field of Classification Search
CPC ... G09G 2300/0842; G09G 2320/0223; G09G 2300/0819; G09G 2310/08; G09G 2320/0214; G09G 2330/021; G09G 2320/043; G09G 2320/0233; H01L 27/3265; H01L 27/3262; H01L 27/3276
See application file for complete search history.

(56) References Cited

U.S. PATENT DOCUMENTS

| | | | |
|---|---|---|---|
| 2011/0310076 A1 | 12/2011 | Kim | |
| 2012/0002334 A1* | 1/2012 | Kosonocky | H01L 27/0292 361/56 |
| 2013/0050292 A1* | 2/2013 | Mizukoshi | G09G 3/3291 345/690 |
| 2013/0093748 A1 | 4/2013 | Cho | |
| 2013/0162175 A1 | 6/2013 | Kim | |
| 2013/0314139 A1 | 11/2013 | Umezaki | |
| 2014/0110731 A1* | 4/2014 | Umezaki | G02F 1/13624 257/88 |

FOREIGN PATENT DOCUMENTS

| | | |
|---|---|---|
| CN | 103050085 A | 4/2013 |
| KR | 10-2008-0042323 A | 5/2008 |
| KR | 10-2011-0138722 A | 12/2011 |
| KR | 10-2012-0021818 A | 3/2012 |
| KR | 10-2013-0028778 A | 3/2013 |
| KR | 10-2013-0074345 A | 7/2013 |

OTHER PUBLICATIONS

Notice of Allowance dated Jul. 19, 2018, issued in counterpart Korean Patent Application No. 10-2015-0171022.

Second Notification of Office Action dated Jul. 2, 2019, issued in counterpart Chinese Patent Application No. 201611100637.3.

* cited by examiner

DISPLAY DEVICE AND PRINTED CIRCUIT BOARD FOR SUPPLYING VOLTAGE TO THE DISPLAY DEVICE

CROSS-REFERENCE TO RELATED APPLICATIONS

This application claims priority to and the benefit under 35 U.S.C. § 119(a) of Korean Patent Application No. 2015-0171022, filed on Dec. 2, 2015, which is hereby incorporated by reference for all purposes as if fully set forth herein.

BACKGROUND

Field of the Invention

Embodiments of the present invention relate to a display device, and a printed circuit board for supplying a driving voltage and a base voltage to the display device.

Description of the Related Art

An organic light emitting display device, which has recently attracted attention, uses a self-emitting organic light emitting diode (OLED). Such an organic light emitting display device therefore has advantages including a high response speed and increased contrast ratio, light emitting efficiency, brightness, and viewing angle, as compared to other display device technologies.

Each sub-pixel disposed in the organic light emitting display device typically includes a driving transistor configured to drive an OLED, a switching transistor configured to transfer a data voltage to a gate node of the driving transistor, and a capacitor configured to maintain a certain voltage for one frame time.

The driving transistor within each sub-pixel typically has characteristics such as a threshold voltage, mobility, etc. Such characteristics may vary by sub-pixel.

Further, as a driving time is increased, the driving transistor may degrade and its characteristics may change. A difference in degradation between sub-pixels may therefore cause variations in characteristics between sub-pixels.

The variations in characteristics between sub-pixels may cause a brightness variation and thus brightness unevenness of the organic light emitting display device. Accordingly, a technology for measuring characteristics of each sub-pixel and compensating therefor has been developed.

Meanwhile, the measurement or compensation for characteristics of a sub-pixel should be performed without being recognized by a user. For example, if the OLED emits a light in response to a voltage supplied to the driving transistor for measuring the characteristics, an image irrelevant to image data may be displayed on a pixel, and the pixel may be recognized as an error by the user.

In order for the OLED not to emit a light during the measurement of characteristics, the display device may supply a higher voltage as a base voltage than the voltage supplied when the OLED is driven. For example, typically, when the OLED is driven, the display device may supply a ground voltage as a base voltage. However, during the measurement of characteristics, the display device may supply a higher voltage as a base voltage. Thus, it is possible to suppress light emission of the OLED during the measurement of characteristics.

However, when a voltage different from the ground voltage is supplied as a base voltage, switching noise from the power supply may influence measurement of the characteristics.

Generally, a switched mode power supplier (SMPS) is used to generate direct-current (DC) power. A DC voltage generated in the SMPS may undesirably include a switching noise, which is also referred to as a ripple noise. The switching noise may be inevitably generated according to a driving method of the SMPS.

This switching noise can influence the measurement of characteristics of the display device. For example, there may be a parasitic capacitance between a line for supplying a base voltage to the OLED and a line for measuring characteristics. The above-described switching noise may be propagated from the line for supplying the base voltage to the line for measuring characteristics through this parasitic capacitance, and thus influence measurement of the characteristics.

SUMMARY

In view of the foregoing, an object of the present invention is to provide a technology for reducing an influence of noise included in a voltage supplied to a panel during the measurement of characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of embodiments of the present invention, as embodied and broadly described, a display device comprises a switching circuit; a sub-pixel including a driving transistor and an organic light emitting diode (OLED) having an anode and a cathode, the anode connected to the driving transistor; a driving voltage supply line configured to supply a driving voltage to the OLED through the driving transistor; a base voltage supply line connected to the cathode of the OLED, the switching circuit configured to supply a base voltage to the cathode of the OLED through the base voltage supply line; a ground line configured to supply a ground voltage to the switching circuit; a first capacitor connected between the driving voltage supply line and the ground line; and a second capacitor connected between the base voltage supply line and the ground line, wherein the switching circuit is configured to selectively supply one of a first level voltage and a second level voltage as the base voltage, wherein the second level voltage is higher than the first level voltage, and the first level voltage is the ground voltage, wherein when the first level voltage is supplied as the base voltage, the switching circuit connects the base voltage supply line to the ground line, and wherein when the second level voltage is supplied as the base voltage, the switching circuit supplies the second level voltage to the base voltage supply line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
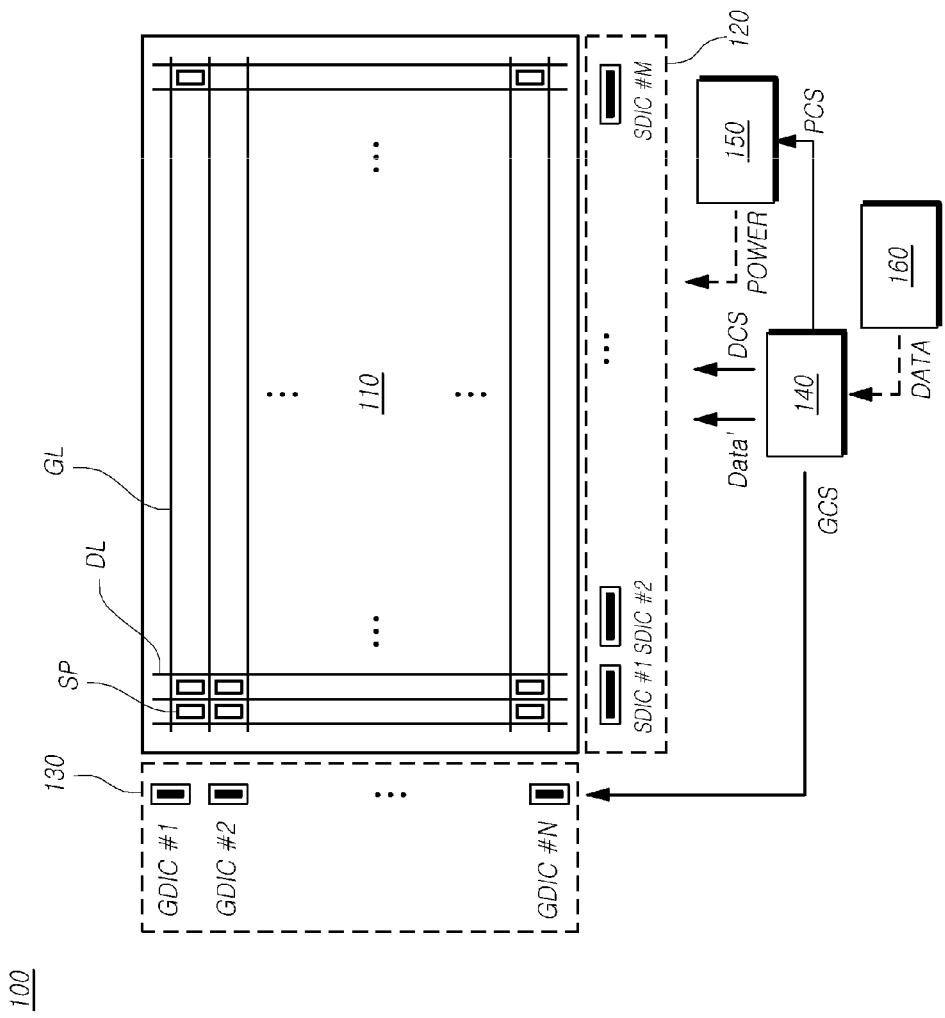
FIG. 1 is a schematic system configuration view of a display device to which an example embodiment can be applied.

Reference will now be made in detail to example embodiments of the present invention, examples of which are illustrated in the accompanying drawings.

In adding reference numerals to components throughout the drawings, it is to be noted that like reference numerals designate like components even though components are shown in different drawings. Further, in explaining the example embodiments of the present invention, a detailed explanation of well-known components or functions may be omitted to avoid unnecessarily obscuring the subject matter of the present invention.

Further, in describing components of the present invention, terms such as first, second, A, B, (a), (b), etc., can be used. These terms are used only to differentiate the components from other components. Therefore, the nature, order, sequence, etc., of the corresponding components are not limited by these terms. It is to be understood that when one element is referred to as being "connected to" or "coupled to" another element, it may be connected directly to or coupled directly to another element or be connected to or coupled to another element, having still another element intervening therebetween. In the same context, it is to be understood that when one element is referred to as being "on" or "below" another element, it may be directly coupled "on" or "below" another element or be connected "on" or "below" another element or may be indirectly coupled "on" or "below" another element or be connected "on" or "below" another element, having still another element intervening therebetween.

FIG. 1 is a schematic system configuration view of a display device to which an example embodiment can be applied.

The display device to which an example embodiment can be applied may be a liquid crystal display device, an organic light emitting display device, or another display device. An example embodiment to be described below can be applied to a display device which measures pixel unevenness or pixel degradation occurring in a panel and in which a voltage supplied to the panel includes a switching noise. Hereinafter, the display device will be described as an organic light emitting display device for convenience in understanding.

With reference to FIG. 1, an organic light emitting display device 100 includes an organic light emitting display panel 110, a data driver 120, a gate driver 130, a timing controller 140, and a power management integrated circuit 150. In the organic light emitting display panel 110, a plurality of data lines DL is disposed in a first direction, and a plurality of gate lines GL is disposed in a second direction intersecting with the first direction.

Further, in the organic light emitting display panel 110, a plurality of sub-pixels SP is disposed in a matrix pattern. Further, in each sub-pixel SP, circuit elements such as a transistor and a capacitor are formed. For example, in each sub-pixel of the organic light emitting display panel 110, a circuit including an organic light emitting diode (OLED), two or more transistors, and one or more capacitors is formed.

The data driver 120 is configured to drive the plurality of data lines DL by supplying a data voltage to the plurality of data lines DL.

The gate driver 130 is configured to sequentially drive the plurality of gate lines GL by supplying a scan signal to the plurality of gate lines GL.

The timing controller 140 is configured to control the data driver 120 and the gate driver 130 by supplying a control signal to the data driver 120 and the gate driver 130.

The timing controller 140 starts a scan according to timing implemented in each frame, converts image data input from a host system 160 in correspondence to a data signal form used by the data driver 120, outputs the converted image data, and controls a driving of data at a proper time according to the scan.

The gate driver 130 sequentially drives the plurality of gate lines GL by supplying a scan signal of ON voltage or OFF voltage to the plurality of gate lines GL according to the control of the timing controller 140.

The gate driver 130 may be positioned on only one side of the organic light emitting display panel 110, as illustrated in FIG. 1, or on both sides thereof, depending on a driving method. Further, the gate driver 130 may include one or more gate driver integrated circuits (GDIC) GDIC #1 , . . . , GDIC #N, (N is a natural number of 1 or more).

Further, the one or more gate driver integrated circuits GDIC #1 , . . . , GDIC #N included in the gate driver 130 may be connected to a bonding pad of the organic light emitting display panel 110 through a Tape Automated Bonding (TAB) method or a Chip On Glass (COG) method, or implemented in a Gate In Panel (GIP) type and directly disposed in the organic light emitting display panel 110, or integrated and disposed in the organic light emitting display panel 100.

Each of the one or more gate driver integrated circuits GDIC #1 , . . . , GDIC #N included in the gate driver 130 may include a shift register and a level shifter.

When a specific gate line is opened, the data driver 120 converts image data Data' received from the timing controller 140 into a data voltage of an analog form, and supplies the data voltage to the data lines to drive the plurality of data lines DL.

The data driver 120 may include one or more source driver integrated circuits (SDIC, also referred to as data driver ICs) SDIC #1 , . . . , SDIC #M (M is a natural number of 1 or more). The one or more source driver integrated circuits SDIC #1 , . . . , SDIC #M included in the data driver 120 may be connected to a bonding pad of the organic light emitting display panel 110 through a Tape Automated Bonding (TAB) method or a Chip On Glass (COG) method, or directly disposed in the organic light emitting display panel 110, or integrated and disposed in the organic light emitting display panel 100.

Each of the one or more source driver integrated circuits SDIC #1 , . . . , SDIC #M included in the data driver 120 may include a shift register, a latch, a digital to analog converter (DAC), and an output buffer, and may further include an analog to digital converter (ADC) configured to sense an analog voltage value, convert the analog voltage value to a digital value, and generate and output sensing data for compensation of a sub-pixel.

Further, each of the one or more source driver integrated circuits SDIC #1 , . . . , SDIC #M included in the data driver 120 may be implemented in a Chip On Film (COF) type. In each of the one or more source driver integrated circuits SDIC #1 , . . . , SDIC #M, one end is bonded to at least one source printed circuit board and the other end is bonded to the organic light emitting display panel 110.

Meanwhile, the timing controller 140 receives image data DATA of an input image together with various timing signals, such as a vertical synchronization signal Vsync, a horizontal synchronization signal Hsync, a data enable (DE) signal, a clock signal CLK, etc., from the external host system 160.

The timing controller 140 converts the image data DATA input from the host system 160 in correspondence to a data signal form used by the data driver 120 and outputs the converted image data Data'. Further, the timing controller 140 receives the timing signals, such as the vertical synchronization signal Vsync, horizontal synchronization signal Hsync, data enable (DE) signal, clock signal CLK, etc., generates various control signals, and outputs the control signals to the data driver 120 and the gate driver 130 in order to control the data driver 120 and the gate driver 130.

For example, the timing controller 140 outputs various gate control signals (GCS) including a gate start pulse (GSP), a gate shift clock (GSC), a gate output enable (GOE) signal, etc., in order to control the gate driver 130. The gate start pulse (GSP) controls an operation start timing of the one or more gate driver integrated circuits GDIC #1 , . . . , GDIC #N included in the gate driver 130. The gate shift clock (GSC) is a clock signal commonly input to the one or more gate driver integrated circuits GDIC #1 , . . . , GDIC #N, and controls a shift timing of a scan signal (gate pulse). The gate output enable (GOE) signal designates timing information of the one or more gate driver integrated circuits GDIC #1 , . . . , GDIC #N.

The timing controller 140 outputs various data control signals (DCS) including a source start pulse (SSP), a source sampling clock (SSC), a source output enable (SOE) signal, etc., in order to control the data driver 120. The source start pulse (SSP) controls a data sampling start timing of the one or more source driver integrated circuits SDIC #1 , . . . , SDIC #M constituting the data driver 120. The source sampling clock (SSC) is a clock signal for controlling a data sampling timing in each of the one or more source driver integrated circuits SDIC #1 , . . . , SDIC #M. The source output enable (SOE) signal controls an output timing of the data driver 120.

With reference to FIG. 1, the timing controller 140 may be disposed in the source printed circuit board to which the source driver integrated circuits SDIC #1 , . . . , SDIC #M are bonded and connected to a control printed circuit board through a flexible flat cable (FFC) or a flexible printed circuit (FPC).

The power management integrated circuit (PMIC) 150 may be disposed in the control printed circuit board. This power management integrated circuit 150 may be configured to supply various voltages and/or currents to the organic light emitting display panel 110, the data driver 120, and the gate driver 130, or may control various voltages and/or currents to be supplied thereto.

For example, the power management integrated circuit 150 may generate a gate high voltage (VGH) and a gate low voltage (VGL) for driving a gate. Further, the power management integrated circuit 150 may generate a logic voltage VCC for driving digital logic circuits.

Also, the power management integrated circuit 150 may supply a base voltage EVSS to a cathode of the organic light emitting diode OLED positioned in a sub-pixel, in order to drive the organic light emitting diode OLED.

The power management integrated circuit 150 may change a status of an output voltage using a power control signal (PCS) received from the timing controller 140. For example, the power management integrated circuit 150 may stop generation or output of some voltages in response to a sleep mode instruction received from the timing controller 140. As a more specific example, the power management integrated circuit 150 may stop generation or output of a driving voltage (EVDD) of the organic light emitting diode OLED in response to the sleep mode instruction. In this case, the driving voltage EVDD is not supplied to the pixels in the organic light emitting display panel 110, and a screen is kept in an OFF state.

While characteristics of a driving transistor DRT are measured, the organic light emitting display device 100 may set a high voltage to be supplied to the cathode of the organic light emitting diode OLED in order for the organic light emitting diode OLED not to emit light.

Figure 2:
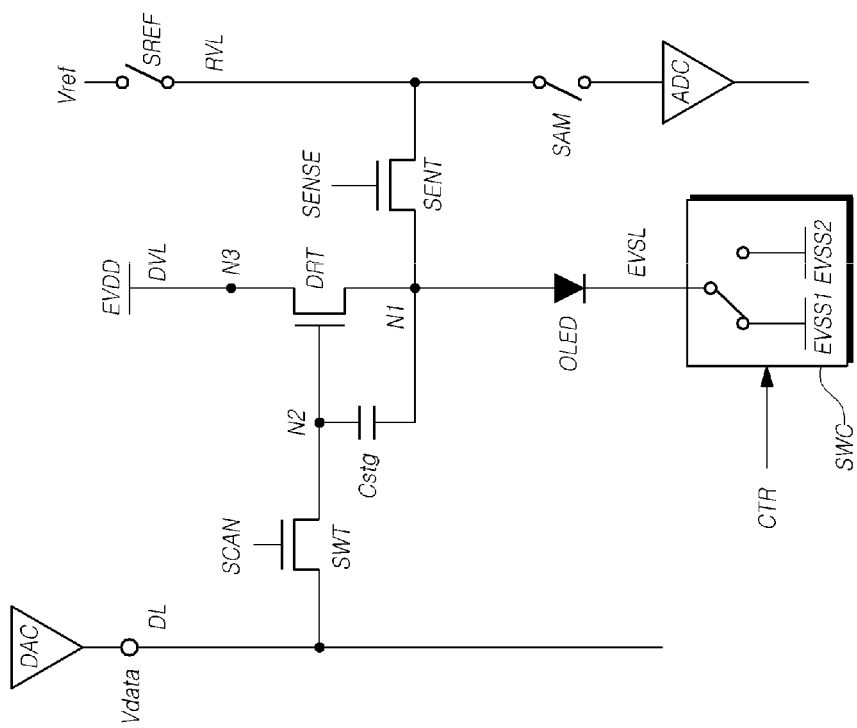
FIG. 2 is an example diagram of a pixel region circuit and a peripheral circuit for measuring characteristics of a pixel region of an organic light emitting display device to which an example embodiment can be applied.

FIG. 2 is an example diagram of a pixel region circuit and a peripheral circuit for measuring characteristics of a pixel region of an organic light emitting display device to which an example embodiment can be applied.

With reference to FIG. 2, in each pixel region of the organic light emitting display device 100, the organic light emitting diode OLED and a driving sensing circuit of the organic light emitting diode OLED are disposed.

The driving sensing circuit may include three transistors (a driving transistor DRT, a switching transistor SWT, and a sensing transistor SENT) and one capacitor (a storage capacitor Cstg). As such, a sub-pixel including the three transistors DRT, SWT, and SENT and the one capacitor Cstg may be referred to as having a "3T1C structure".

The organic light emitting diode OLED includes an anode, an organic layer, and a cathode. The anode may be electrically connected to a source node or a drain node of the driving transistor DRT, and the cathode may be supplied with the base voltage EVSS through a base voltage line EVSL.

The driving transistor DRT is configured to drive the organic light emitting diode OLED by supplying a driving current to the organic light emitting diode OLED.

The driving transistor DRT includes a first node (N1 node) corresponding to a source node or drain node, a second node (N2 node) corresponding to a gate node, and a third node (N3 node) corresponding to the other of a drain node or source node.

In the driving transistor DRT, the N1 node may be electrically connected to the anode of the organic light emitting diode OLED, and the N3 node may be electrically connected to a driving voltage line DVL for supplying the driving voltage EVDD.

The switching transistor SWT is configured to transfer a data voltage Vdata to the N 2 node corresponding to the gate node of the driving transistor DRT.

The switching transistor SWT is controlled by a scan signal SCAN applied to the gate node and electrically connected between the N2 node of the driving transistor DRT and the data line DL.

With reference to FIG. 2, the storage capacitor Cstg may be electrically connected between the N1 node and the N2 node of the driving transistor DRT.

The storage capacitor Cstg is configured to maintain a certain voltage for one frame time.

The sensing transistor SENT is controlled by a sense signal SENSE, which is a kind of scan signal applied to its gate node, and is electrically connected between a sensing line (reference voltage line) RVL and the N1 node of the driving transistor DRT. The sensing line RVL is also referred to as a reference voltage line, since a reference voltage (Vref) is supplied when the organic light emitting diode OLED is driven, but will simply be referred to as the sensing line RVL in the following description.

When the sensing transistor SENT is turned on, the sensing transistor SENT may apply the reference voltage Vref, supplied through the sensing line RVL, to the N1 node (e.g., the source node or the drain node) of the driving transistor DRT.

Further, the sensing transistor SENT enables a voltage of the N1 node of the driving transistor DRT to be sensed by the analog to digital converter ADC electrically connected to the sensing line RVL. This function of the sensing transistor SENT is related to a function of compensating for characteristics (e.g., threshold voltage and mobility) of the driving transistor DRT.

In this regard, if there is a variation in the characteristics (threshold voltage and mobility) between the driving transistors DRT in each pixel region, there may be a brightness variation which may cause deterioration in image quality.

Accordingly, by sensing the characteristics (threshold voltage and mobility) of the driving transistor DRT in each pixel region and compensating for the characteristics (threshold voltage and mobility) between the driving transistors DRT, uniformity of brightness (evenness) can be improved.

The organic light emitting display device 100 may further include the analog to digital converter ADC configured to sense a voltage (Vsense) of the sensing line RVL. The organic light emitting display device 100 may convert the sensed voltage Vsense into a digital value to generate sensing data, and transmit the generated sensing data to the timing controller 140.

With the analog to digital converter ADC, the timing controller 140 can calculate a digital-based compensation value and compensate for data.

The analog to digital converter ADC may be included in each source driver integrated circuit SDIC, together with the digital to analog converter DAC configured to convert image data into a data voltage Vdata.

The organic light emitting display device 100 may include switches such as a first switch SAM and a second switch SREF. The first switch SAM may connect the sensing line RVL and the analog to digital converter ADC in response to a sampling signal. Further, the second switch SREF may input the reference voltage Vref to the sensing line RVL.

The cathode of the organic light emitting diode OLED may be electrically connected to a switching circuit SWC through a base voltage line EVSL. Through this connection, the switching circuit SWC may supply a first level voltage EVSS1 and a second level voltage EVSS2 to the cathode of the organic light emitting diode OLED.

The switching circuit SWC may receive a control signal CTR indicating an operation mode and determine whether to output the first level voltage EVSS1 or the second level voltage EVSS2 to the cathode of the organic light emitting diode OLED in response to the control signal CTR. For example, the control signal CTR may be an OFFRS signal, which is a signal generated when the organic light emitting display device 100 is turned off. In response to the OFFRS signal, the organic light emitting display device 100 may perform operations (e.g., an operation of measuring a threshold voltage of the driving transistor DRT) that require a rather long time.

When the organic light emitting display device 100 supplies the second level voltage EVSS2 to the cathode of the organic light emitting diode OLED during measurement of characteristics, switching noise from the power supply may be propagated to the sensing line RVL, and thus may influence the measurement of characteristics.

Figure 3:
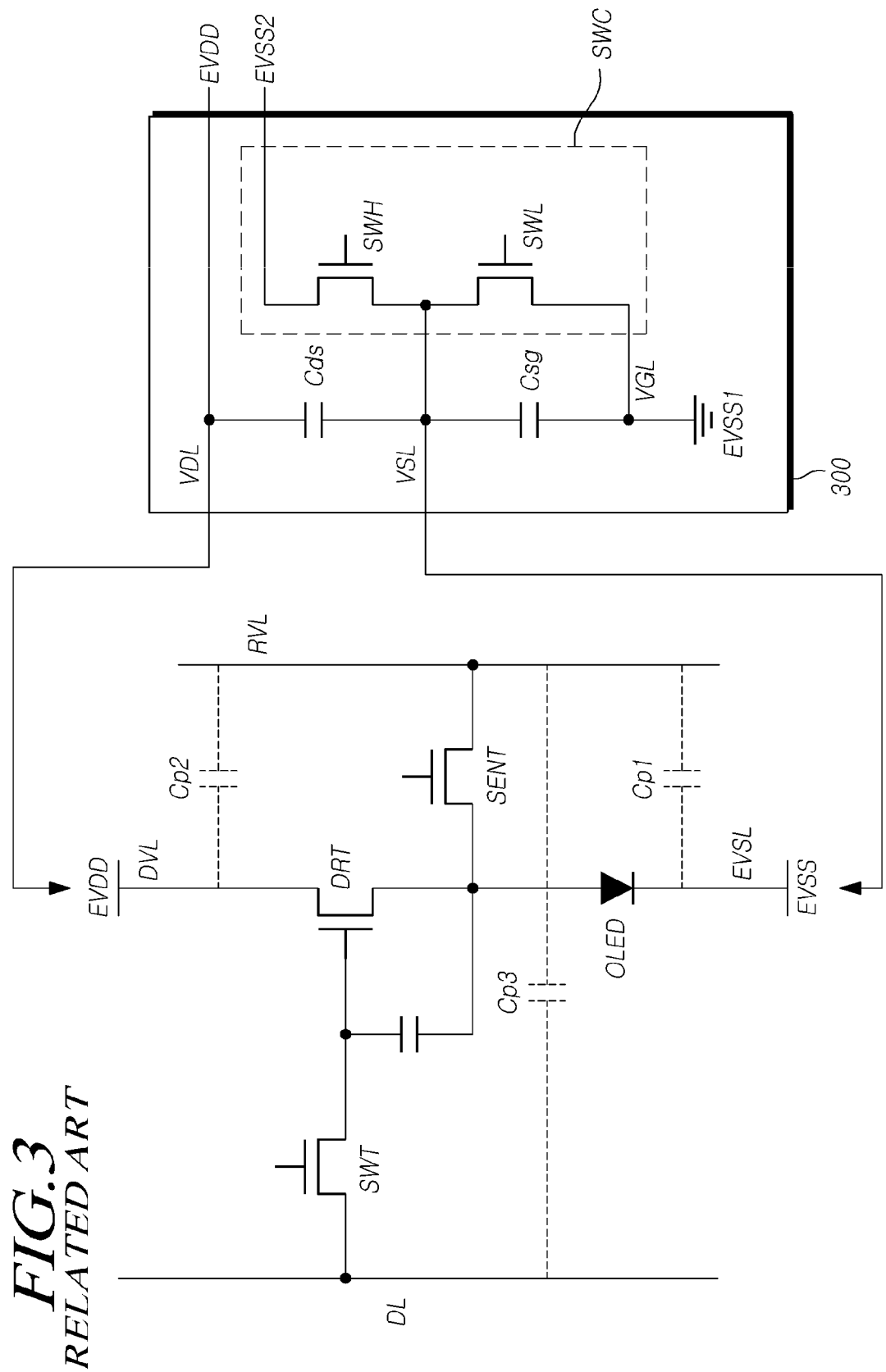
FIG. 3 is a diagram illustrating a configuration view of a related art printed circuit board for supplying a driving voltage and a base voltage to a pixel region circuit and a pixel region of an organic light emitting display device.
Figure 4:
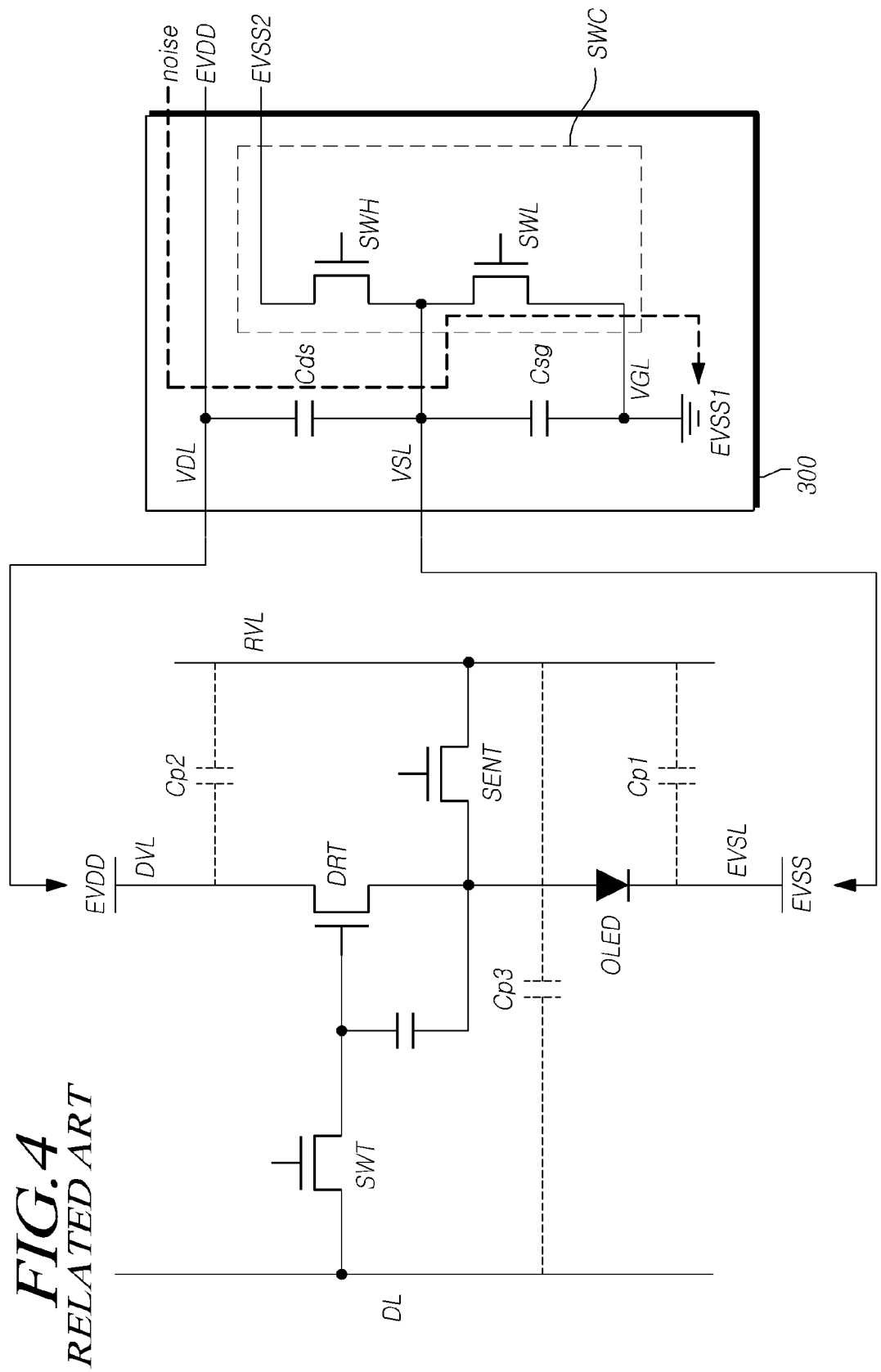
FIG. 4 is a diagram illustrating a switching noise propagation path when a first level voltage is supplied as the base voltage in FIG. 3.
Figure 5:
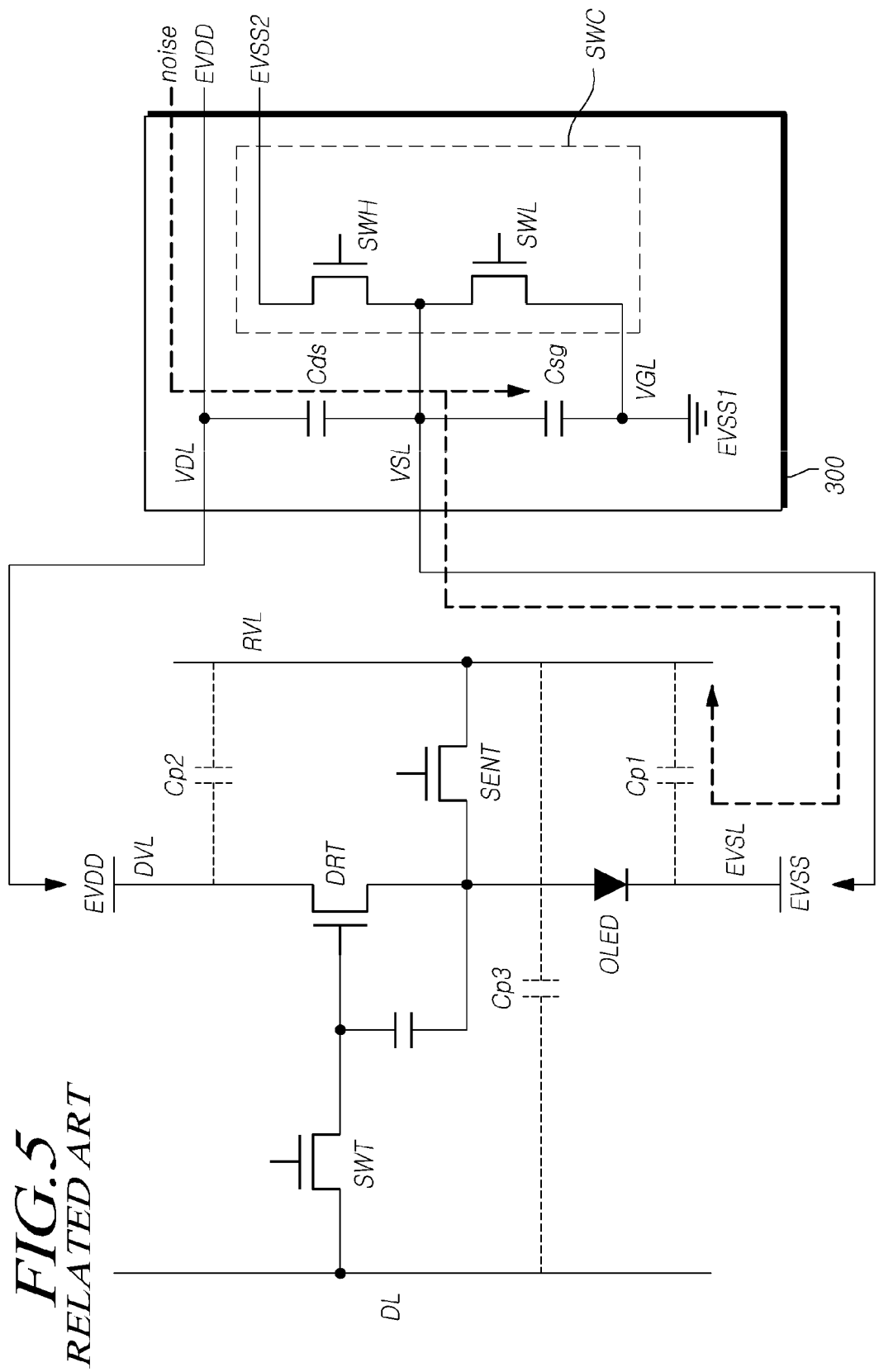
FIG. 5 is a diagram illustrating a switching noise propagation path when a second level voltage is supplied as the base voltage in FIG. 3.

FIG. 3 through FIG. 5 are diagrams each illustrating a switching noise propagation path according to related art.

FIG. 3 is a diagram illustrating a configuration view of a related art printed circuit board for supplying a driving voltage and a base voltage to a pixel region circuit and a pixel region of an organic light emitting display device.

With reference to FIG. 3, lines disposed in a pixel region of the organic light emitting display device 100 are capacitively coupled, and there may be a parasitic capacitance between the lines.

For example, a first parasitic capacitance Cp1 may be formed between the base voltage line EVSL and the sensing line RVL, a second parasitic capacitance Cp2 may be formed between the driving voltage line DVL and the sensing line RVL, and a third parasitic capacitance Cp3 may be formed between the data line DL and the sensing line RVL.

A related art printed circuit board 300 may propagate a switching noise to the sensing line RVL through the parasitic capacitances while supplying the base voltage EVSS.

The related art printed circuit board 300 includes a driving voltage supply line VDL for transferring the driving voltage EVDD, which is suppled from a switched mode power supplier SMPS to a pixel region. The related art printed circuit board 300 also includes a base voltage supply line VSL connected to the base voltage line EVSL and supplying the base voltage EVSS. Further, a ground line VGL connected to a ground pattern defining the first level voltage EV is included in the related art printed circuit board 300.

Further, the related art printed circuit board 300 includes the switching circuit SWC, and selectively outputs one of the first level voltage EVSS1 and the second level voltage EVSS2 to the base voltage supply line VSL using the switching circuit SWC. The switching circuit SWC includes a first switch SWL and a second switch SWH. When the first switch SWL is turned on, the first level voltage EVSS1 is supplied to the base voltage supply line VSL, and when the second switch SWH is turned on, the second level voltage EVSS2 is supplied to the base voltage supply line VSL.

Further, in the related art printed circuit board 300, capacitors are disposed between the voltage supply lines VDL, VSL, and VGL to stabilize voltages suppled to a pixel region. In the related art printed circuit board 300, a first stabilization capacitor Cds is disposed between the driving voltage supply line VDL and the base voltage supply line VSL, and a second stabilization capacitor Csg is disposed between the base voltage supply line VSL and the ground line VGL. The first stabilization capacitor Cds stably supplies the driving voltage EVDD by reducing the switching noise when the first level voltage EVSS1 is supplied as the base voltage EVSS.

FIG. 4 is a diagram illustrating a switching noise propagation path when a first level voltage is supplied as the base voltage in FIG. 3.

With reference to FIG. 4, when the first level voltage EVSS1 is supplied as the base voltage EVSS, the first switch SWL is turned on and the second switch SWH is turned off in the switching circuit SWC. Accordingly, the base voltage supply line VSL is connected to the ground line VGL.

The driving voltage EVDD is generated in the switched mode power supplier SMPS. Because the switched mode power supplier SMPS generates a voltage by chopping power with a power switch, the generated voltage may inevitably include switching noise. Accordingly, the driving voltage EVDD includes switching noise.

The switching noise included in the driving voltage EVDD is mainly formed of high-frequency components which can be easily propagated through a capacitor.

With reference to FIG. 4, the switching noise included in the driving voltage EVDD is propagated along the driving voltage supply line VDL and then propagated to the base voltage supply line VSL through the first stabilization capacitor Cds positioned between the driving voltage supply line VDL and the base voltage supply line VSL. The first stabilization capacitor Cds stably supplies the driving voltage EVDD by reducing the switching noise when the first level voltage EVSS1 is supplied as the base voltage EVSS.

When the first level voltage EVSS1 is supplied as the base voltage EVSS, the base voltage supply line VSL and the ground line VGL are connected by the switching circuit SWC. Therefore, most of the switching noise propagated to the base voltage supply line VSL flows out to the ground line VGL.

Some of the switching noise may also be propagated to the sensing line RVL through another path. However, typically, a ground pattern is widely formed and has a low impedance. Thus, most of the switching noise connected to the ground pattern flows out to the ground pattern.

FIG. 5 is a diagram illustrating a switching noise propagation path when a second level voltage is supplied as the base voltage in FIG. 3.

With reference to FIG. 5, when the second level voltage EVSS2 is supplied as the base voltage EVSS, the first switch SWL is turned off and the second switch SWH is turned on in the switching circuit SWC. Accordingly, the second level voltage EVSS2 is supplied to the base voltage supply line VSL.

With reference to a propagation path of the switching noise included in the driving voltage EVDD, the switching noise included in the driving voltage EVDD is propagated along the driving voltage supply line VDL and then propagated to the base voltage supply line VSL through the first stabilization capacitor Cds positioned between the driving voltage supply line VDL and the base voltage supply line VSL. The first stabilization capacitor Cds stably supplies the driving voltage EVDD by reducing the switching noise when the first level voltage EVSS1 is supplied as the base voltage EVSS.

Thus, though some of the switching noise propagated to the base voltage supply line VSL may flow out to the ground line VGL through the second stabilization capacitor Csg, the rest of the switching noise may be propagated to the sensing line RVL through the first parasitic capacitance Cp1 formed between the base voltage line EVSL and the sensing line RVL.

When the second level voltage EVSS2 is supplied as the base voltage EVSS, the organic light emitting display device 100 senses characteristics of a pixel region through the sensing line RVL. However, in the related art, during measurement of characteristics, the switching noise may be propagated to the sensing line RVL.

Figure 6:
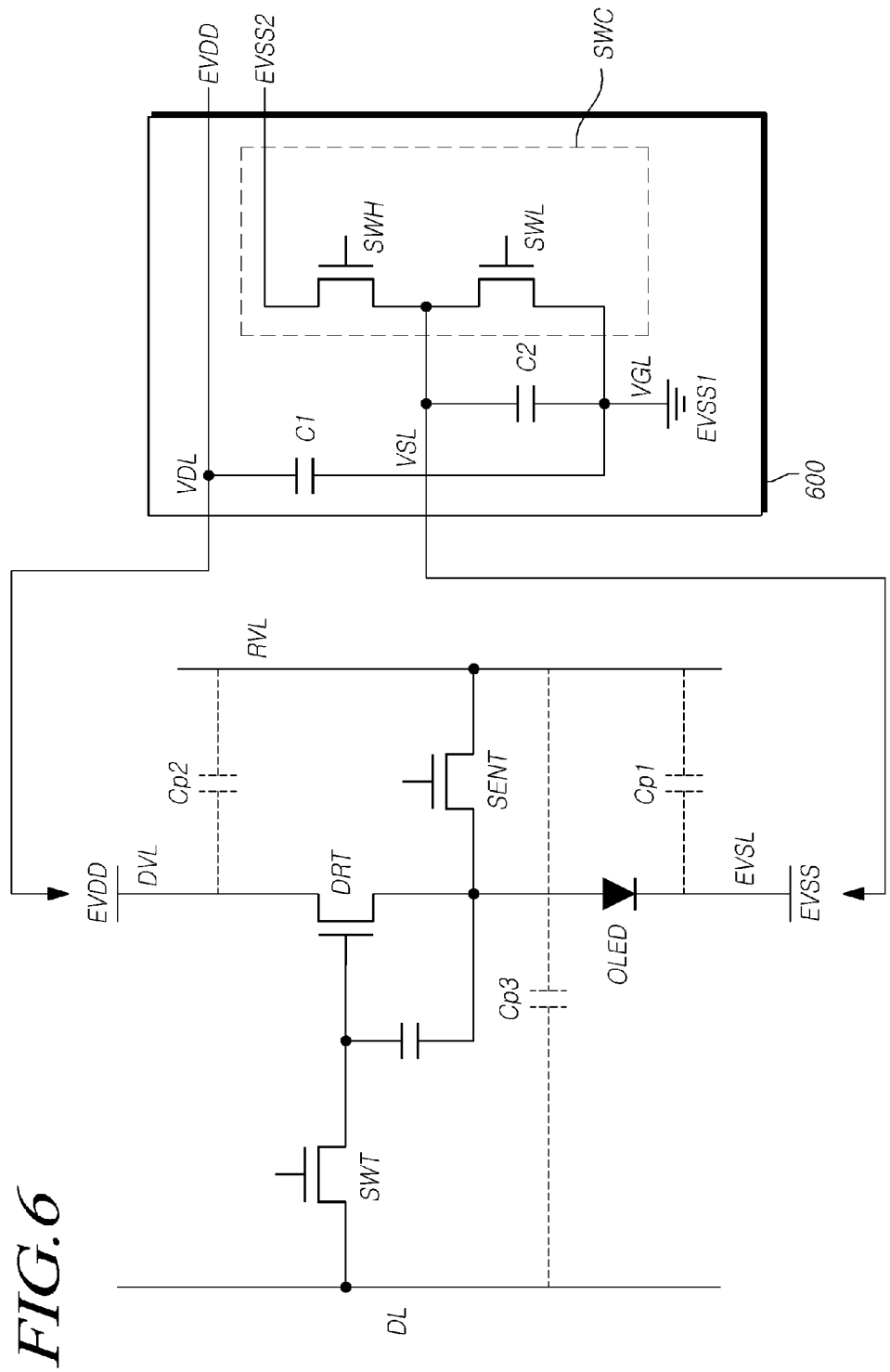
FIG. 6 is a configuration view of a pixel region circuit and a printed circuit board of an organic light emitting display device according to an example embodiment.

FIG. 6 is a configuration view of a pixel region circuit and a printed circuit board of an organic light emitting display device according to an example embodiment.

With reference to FIG. 6, a printed circuit board 600 may include the driving voltage supply line VDL for transferring the driving voltage EVDD suppled from the switched mode power supplier SMPS to a panel, as well as the base voltage supply line VSL connected to the base voltage line EVSL and the ground line VGL supplied with the first level voltage EVSS1.

Further, the printed circuit board 600 may include the switching circuit SWC configured to selectively output one of the first level voltage EVSS1 and the second level voltage EVSS2 to the base voltage supply line VSL. The switching circuit SWC includes the first switch SWL and the second switch SWH. When the first switch SWL is turned on, the first level voltage EVSS1 is supplied to the base voltage supply line VSL, and when the second switch SWH is turned on, the second level voltage EVSS2 is supplied to the base voltage supply line VSL.

In the printed circuit board 600, capacitors are disposed between the voltage supply lines VDL, VSL, and VGL, to stabilize voltages suppled to a pixel region.

For example, a first capacitor C1, of which one side is connected to the driving voltage supply line VDL and the other side is connected to the ground line VGL, is disposed in the printed circuit board 600. Further, a second capacitor C2, of which one side is connected to the base voltage supply line VSL and the other side is connected to the ground line VGL, is disposed in the printed circuit board 600. The first capacitor C1 stably supplies the driving voltage EVDD by reducing the switching noise in the driving voltage EVDD as the first stabilization capacitor Cds does in the related arts when the first level voltage EVSS1 is supplied as the base voltage EVSS and makes the switching noise in the driving voltage EVDD flow out through the ground line VGL and an influence of the switching noise on the sensing line RVL be reduced when the second level voltage EVSS2 is supplied as the base voltage EVSS.

Figure 7:
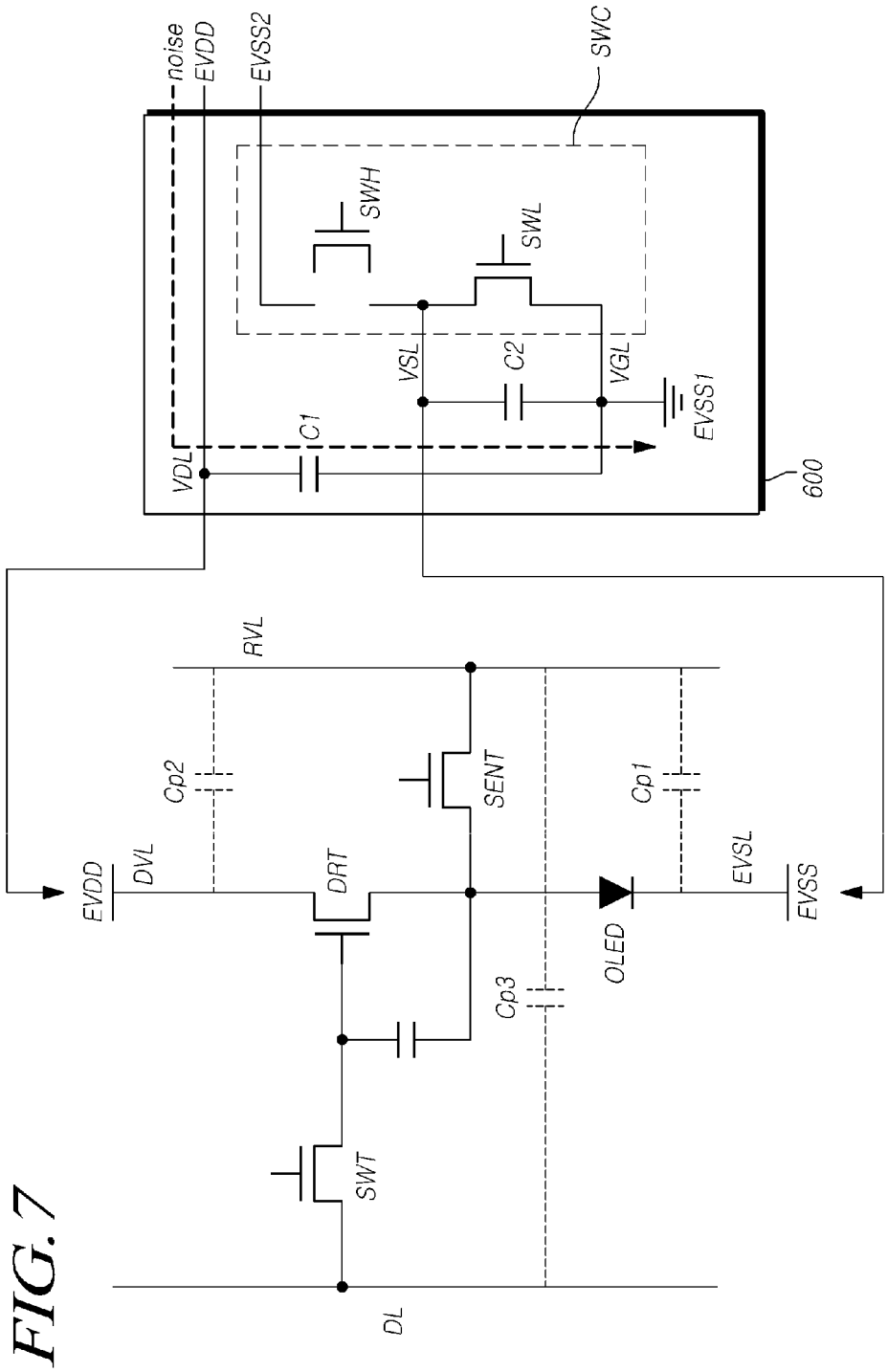
FIG. 7 is a diagram illustrating a switching noise propagation path when a first level voltage is supplied as a base voltage in FIG. 6.
Figure 8:
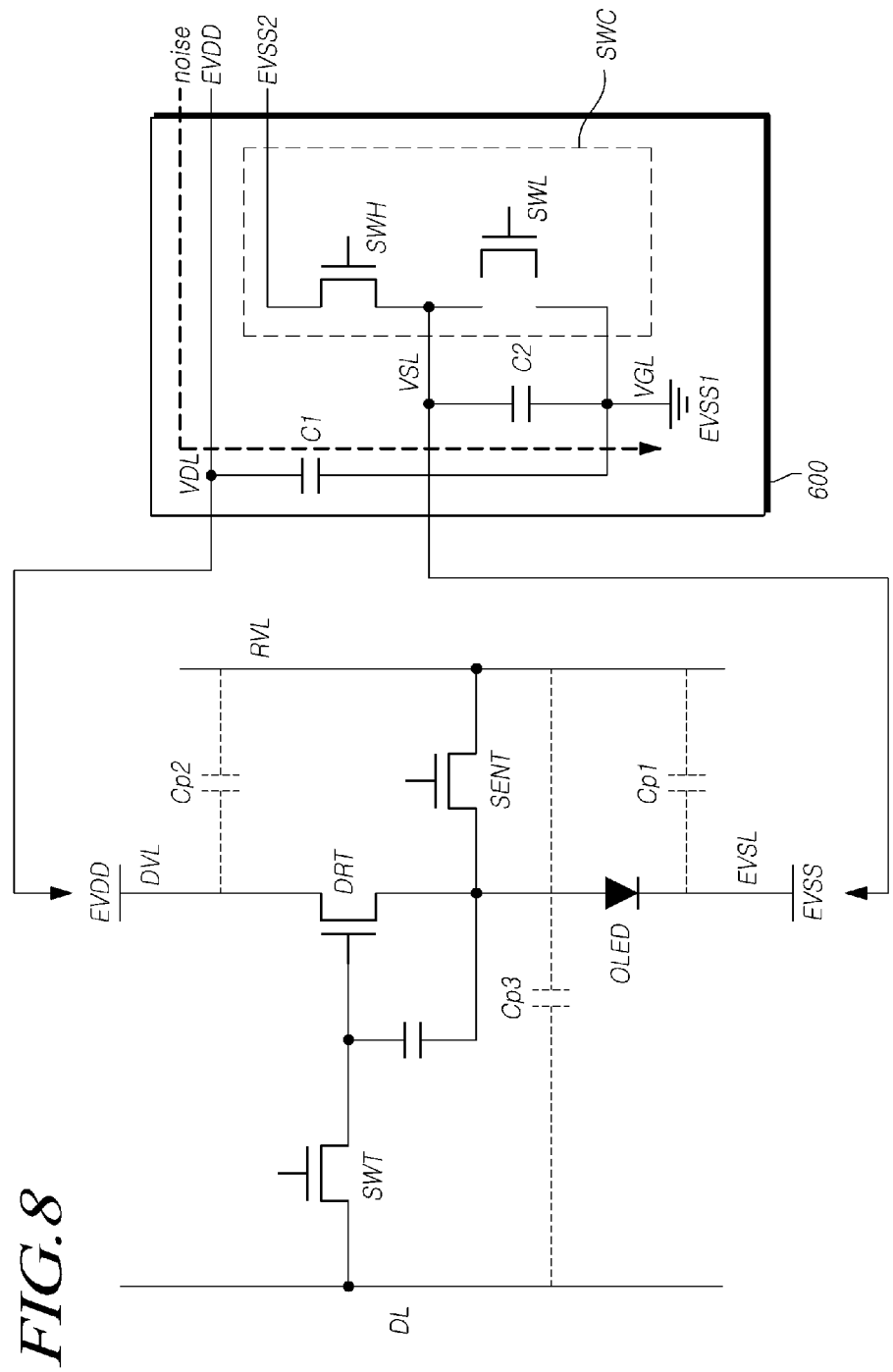
FIG. 8 is a diagram illustrating a switching noise propagation path when a second level voltage is supplied as a base voltage in FIG. 6.

FIG. 7 is a diagram illustrating a switching noise propagation path when a first level voltage is supplied as a base voltage in FIG. 6, and FIG. 8 is a diagram illustrating a switching noise propagation path when a second level voltage is supplied as a base voltage in FIG. 6.

With reference to FIG. 7 and FIG. 8, it can be seen that both in cases where the switching circuit SWC turns on the first switch SWL (FIG. 7) and where the switching circuit SWC turns on the second switch SWH (FIG. 8), the switching noise included in the driving voltage EVDD flows out through the ground line VGL.

In the printed circuit board 600 according to an example embodiment, a capacitor for capacitive coupling is not disposed between the driving voltage supply line VDL and the base voltage supply line VSL, and, thus, the switching noise introduced through the driving voltage supply line VDL is not propagated to the base voltage supply line VSL.

Accordingly, in the printed circuit board 600 according to an example embodiment, an influence of the switching noise included in the driving voltage EVDD on the sensing line RVL is reduced.

Figure 9:
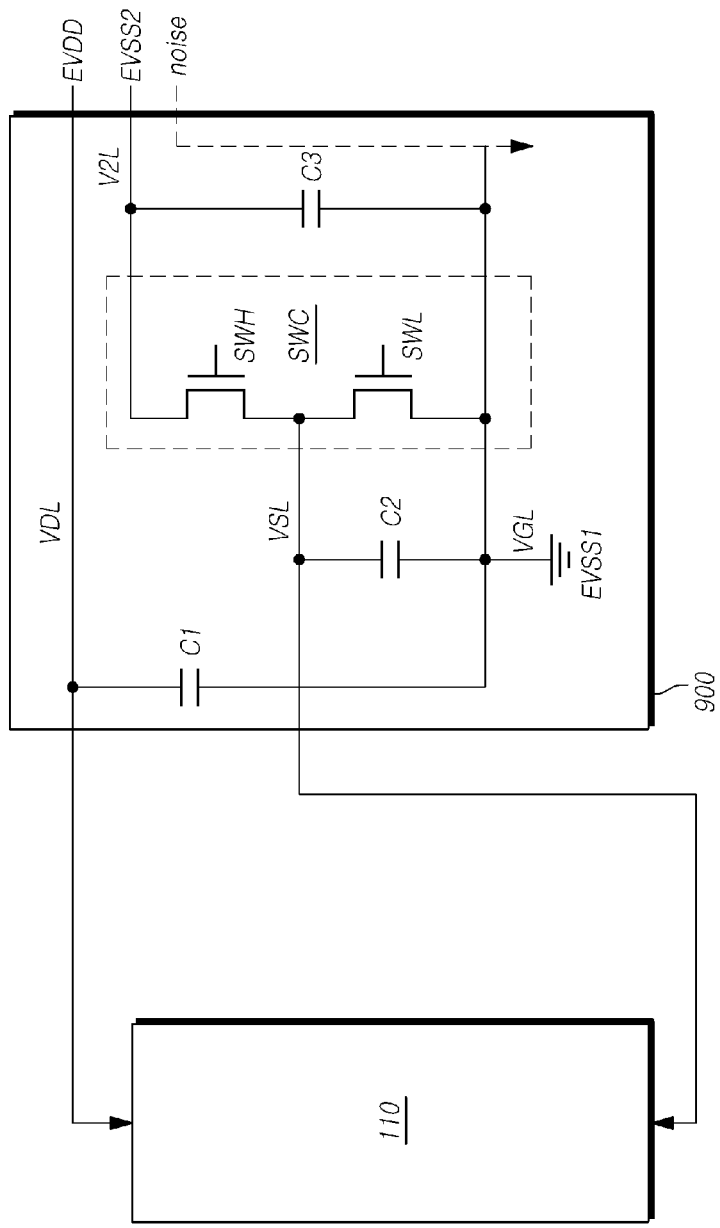
FIG. 9 is a diagram illustrating an example embodiment where a third capacitor is further added to the printed circuit board of FIG. 6.

FIG. 9 is a diagram illustrating an example embodiment where a third capacitor is further added to the printed circuit board of FIG. 6.

With reference to FIG. 9, in a printed circuit board 900, a second level voltage supply line V2L for transferring the second level voltage EVSS2 to the base voltage supply line VSL may be further disposed.

The switching circuit SWC selectively connects one of the second level voltage supply line V2L and the ground line VGL to the base voltage supply line VSL, and thus supplies the first level voltage EVSS1 or the second level voltage EVSS2 to the base voltage supply line VSL.

The second level voltage EVSS2 may be supplied from the switched mode power supplier SMPS, and thus may include switching noise.

The switching noise included in the second level voltage EVSS2 may flow out to the ground line VGL through the second capacitor C2 positioned between the base voltage supply line VSL and the ground line VGL. Also, in order to further remove the switching noise, the printed circuit board 900 may further include a third capacitor C3 positioned between the second level voltage supply line V2L and the ground line VGL.

With reference to FIG. 9, the printed circuit board 900 further includes the third capacitor C3 of which one side is connected to the second level voltage supply line V2L and the other side is connected to the ground line VGL. The switching noise included in the second level voltage EVSS2 can be easily removed to the ground line VGL through the third capacitor C3.

Meanwhile, there may not be only one printed circuit board, but instead may be two or more printed circuit boards.

Figure 10:
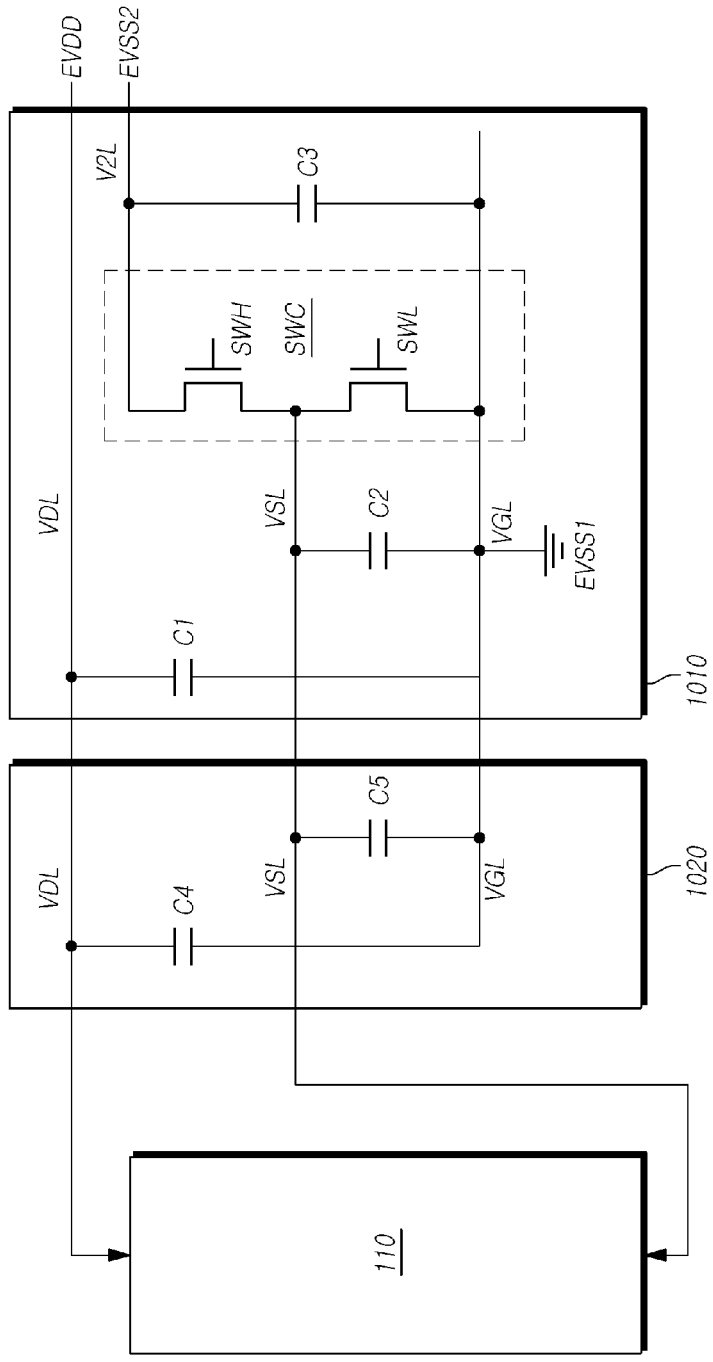
FIG. 10 is a diagram illustrating an example embodiment where a printed circuit board is further added to FIG. 9.

FIG. 10 is a diagram illustrating an example embodiment where another printed circuit board is further added to the example embodiment of FIG. 9.

With reference to FIG. 10, the organic light emitting display device 100 may include a first printed circuit board 1010 and a second printed circuit board 1020. The first printed circuit board 1010 may have the same configuration as the printed circuit board 900 illustrated with reference to FIG. 9.

Examples of the source printed circuit board and the control printed circuit board have been described with reference to FIG. 1. In FIG. 10, the first printed circuit board 1010 may correspond to the control printed circuit board, and the second printed circuit board 1020 may correspond to the source printed circuit board.

The first printed circuit board 1010 and the second printed circuit board 1020 may be disposed to be separated (e.g., physically separated) from each other.

The driving voltage supply line VDL, the base voltage supply line VSL, and the ground line VGL may be disposed over the first printed circuit board 1010 and the second printed circuit board 1020.

Further, the first capacitor C1 and the second capacitor C2 may be positioned on the first printed circuit board 1010. A fourth capacitor C4 (connected between the driving voltage supply line VDL and the ground line VGL) and a fifth capacitor C5 (connected between the base voltage supply line VSL and the ground line VGL) may be positioned on the second printed circuit board 1020.

If two or more printed circuit boards are disposed to be separated from each other in the organic light emitting display device 100, capacitors may be disposed in the respective printed circuit boards in the same manner as in the example embodiment described with reference to FIG. 10. Thus, it is possible to stabilize voltages and also possible to block noise.

Figure 11:
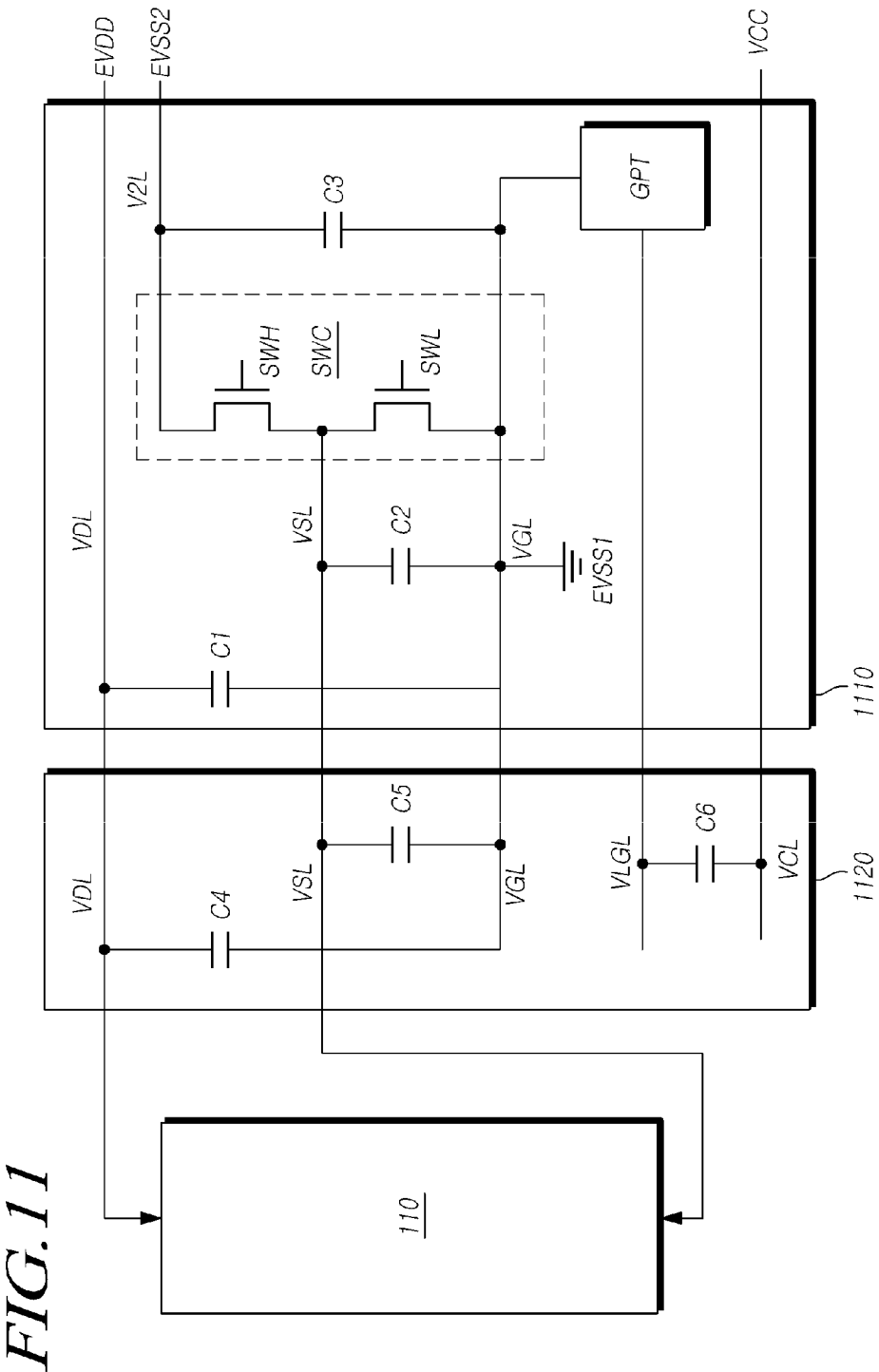
FIG. 11 is a diagram illustrating an example embodiment where a ground pattern is separated from a logic voltage in FIG. 10.

FIG. 11 is a diagram illustrating an example embodiment where a ground pattern is separated from a logic voltage in FIG. 10.

With reference to FIG. 11, the ground line VGL is connected to a ground pattern GPT having a certain area. The ground line VGL supplies a ground voltage with respect to the driving voltage EVDD and the second level voltage EVSS2, and another ground line VLGL is separately formed with respect to the logic voltage VCC.

The logic ground line VLGL connected to the ground pattern GPT is disposed on a first printed circuit board 1110 and a second printed circuit board 1120, and a logic voltage line VCL for supplying the logic voltage VCC is further disposed on the first printed circuit board 1110 and the second printed circuit board 1120.

Because both the logic ground line VLGL and the ground line VGL are connected to the ground pattern GPT, they may be considered as having the same voltage level. However, in actuality, they may have a slight difference in voltage level due to a line resistance or the like.

If the ground line VGL for supplying low power and the logic ground line VLGL for supplying logic power are disposed to be separated from each other, noise propagation therebetween can be reduced. For example, in this structure, an influence of a switching noise flowing out through the ground line VGL on the logic ground line VLGL may be reduced, and propagation of a noise generated in the logic ground line VLGL to another line (e.g., sensing line RVL) through the ground line VGL may be reduced.

Meanwhile, the second printed circuit board 1120 may further include a sixth capacitor C6 of which one side is connected to the logic voltage line VCL and the other side is connected to the logic ground line VLGL. The sixth capacitor C6 has an effect of stabilizing the logic voltage VCC and reducing the propagation of switching noises generated in the gate driver 120 and the data driver 120 (which use the logic voltage) to another line (e.g., sensing line RVL) through the ground line VGL.

For example, the gate driver 130 alternately operates switches in order to generate a pulse included in a scan signal. In this case, a switching noise is generated, and the switching noise may be propagated to the logic ground line VLGL and may influence the sensing line RVL. The sixth capacitor C6 has an effect of reducing propagation of this switching noise.

Figure 12:
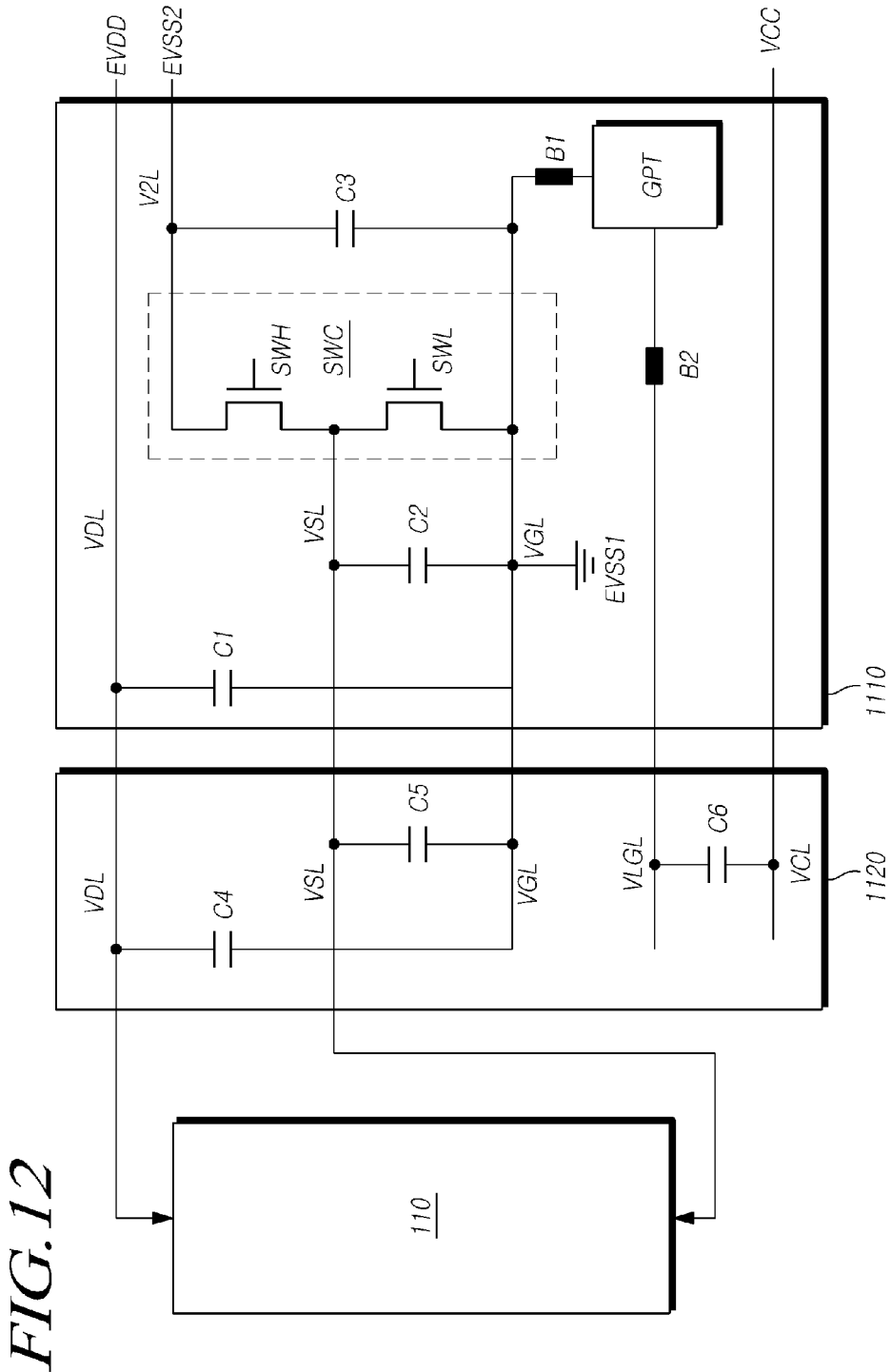
FIG. 12 is a diagram illustrating an example embodiment where a bead is further included in a ground line of FIG. 11.

FIG. 12 is a diagram illustrating an example embodiment where a bead is further included in a ground line of FIG. 11.

With reference to FIG. 12, a bead B1 may be further included between the ground line VGL and the ground pattern GPT. Otherwise, a bead B2 may be further included between the logic ground line VLGL and the ground pattern GPT.

The bead has an effect of blocking a high-frequency current. As described above, switching noise has characteristics of a high frequency, and, thus, can be effectively blocked by the bead B1 or B2.

If the bead B1 or B2 is disposed between the ground line VGL and the logic ground line VLGL separated from each other, the bead B1 or B2 has an effect of reducing propagation of a switching noise included in the driving voltage EVDD or a switching noise included in the logic voltage VCC through another path.

The example embodiments of the present invention for reducing propagation of a switching noise to the sensing line RVL have been described above. According to these example embodiments, it is possible to reduce an influence of switching noise included in a driving voltage supplied to a panel during measurement of transistor characteristics.

As described above, according to embodiments of the present invention, it is possible to reduce the influence of noise included in a voltage supplied to a panel during the measurement of characteristics.

The term "comprises", "includes" or "has" and/or "comprising", "including" or "having" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added. All terms including technical and scientific terms used in the present invention are in effect equivalent to terms generally understood by those skilled in the art unless they are defined otherwise. Terms defined in a generally used dictionary shall be construed as having meanings equivalent to contextual meanings used in the art, but shall not be construed as having ideal or excessively forming meanings unless they are clearly defined in the present invention.

It will be apparent to those skilled in the art that various modifications and variations can be made in the embodiments of the present invention without departing from the spirit or scope of the invention. Thus, it is intended that the present invention cover the modifications and variations of this invention provided they come within the scope of the appended claims and their equivalents.

What is claimed is:

1. A display device, comprising:
a switching circuit including a first switch and a second switch;
a sub-pixel including a driving transistor, and an organic light emitting diode (OLED) having an anode and a cathode, the anode connected to the driving transistor;
a driving voltage supply line configured to supply a driving voltage to the OLED through the driving transistor;
a base voltage supply line connected to the cathode of the OLED, the switching circuit configured to supply a base voltage to the cathode of the OLED through the base voltage supply line;
a ground line configured to supply a ground voltage to the switching circuit;
a first capacitor connected between the driving voltage supply line and the ground line;
a second capacitor connected between the ground line and the base voltage supply line at a node between the first switch and the second switch,
wherein the switching circuit is configured to selectively supply one of a first level voltage and a second level voltage as the base voltage,
wherein the second level voltage is higher than the first level voltage, and the first level voltage is the ground voltage,
wherein when the first level voltage is supplied as the base voltage, the first switch is turned on and the second switch is turned off, and the first switch connects the base voltage supply line to the ground line,
wherein when the second level voltage is supplied as the base voltage, the second switch is turned on and the first switch is turned off, and the second switch connects the base voltage supply line to a second level voltage supply line,
wherein the second level voltage supply line is configured to supply the second level voltage to the switching circuit, and
wherein when the second level voltage is supplied as the base voltage, the switching circuit connects the base voltage supply line to the second level voltage supply line;
a third capacitor connected between the second level voltage supply line and the ground line;
a first printed circuit board and a second printed circuit board, the first printed circuit board and the second printed circuit board separate from each other;
the driving voltage supply line, the base voltage supply line, and the ground line disposed over both the first printed circuit board and the second printed circuit board;
the switching circuit, the first capacitor, the second capacitor, and the third capacitor disposed on the first printed circuit board; a fourth capacitor disposed on the second printed circuit board and connected between the driving voltage supply line and the ground line; and
a fifth capacitor disposed on the second printed circuit board and connected between the base voltage supply line and the ground line.

2. The display device of claim 1, wherein the driving transistor includes a threshold voltage characteristic, and the switching circuit is configured to supply the second level voltage as the base voltage during a time when the threshold voltage characteristic is measured by the display device.

3. The display device of claim 1, further comprising:
a ground pattern disposed on the first printed circuit board, the ground line connected to the ground pattern;
a logic ground line disposed over both the first printed circuit board and the second printed circuit board, the logic ground line connected to the ground pattern and configured to supply a logic ground to the display device;
a logic voltage line disposed over both the first printed circuit board and the second printed circuit board, the logic voltage line configured to supply a logic voltage to the display device; and
a sixth capacitor connected between the logic voltage line and the logic ground line.

4. The display device of claim 3, further comprising:
a bead connected between the logic ground line and the ground pattern.

5. The display device of claim 3, further comprising:
a bead connected between the ground line and the ground pattern.

* * * * *